(12) United States Patent
Ding et al.

(10) Patent No.: US 6,701,614 B2
(45) Date of Patent: Mar. 9, 2004

(54) METHOD FOR MAKING A BUILD-UP PACKAGE OF A SEMICONDUCTOR

(75) Inventors: Yi-Chuan Ding, Kaohsiung (TW);
In-De Ou, Kaohsiung (TW);
Kun-Ching Chen, Tainan (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/075,231

(22) Filed: Feb. 15, 2002

(65) Prior Publication Data

US 2003/0156402 A1 Aug. 21, 2003

(51) Int. Cl.$^7$ ................................................ H01K 3/22
(52) U.S. Cl. ........................ 29/848; 29/830; 29/832; 29/846; 257/678; 438/100; 438/108; 438/127; 174/524
(58) Field of Search ....................... 29/830, 831, 832, 29/841, 846, 848, 854, 855; 257/678; 438/100, 106, 108, 109, 113, 127; 174/524

(56) References Cited

U.S. PATENT DOCUMENTS

| | | | | |
|---|---|---|---|---|
| 5,102,829 A | * | 4/1992 | Cohn | 29/837 |
| 5,903,052 A | * | 5/1999 | Chen et al. | 257/706 |
| 5,915,753 A | * | 6/1999 | Motomura et al. | 29/830 |
| 5,976,391 A | * | 11/1999 | Belke et al. | 216/13 |
| 6,165,892 A | * | 12/2000 | Chazan et al. | 438/623 |
| 6,271,469 B1 | | 8/2001 | Ma et al. | 174/52.4 |
| 6,281,437 B1 | * | 8/2001 | Anderson et al. | 174/52.4 |
| 6,342,730 B1 | * | 1/2002 | Jung et al. | 257/692 |
| 6,378,201 B1 | * | 4/2002 | Tsukada et al. | 29/852 |
| 6,432,748 B1 | * | 8/2002 | Hsu | 438/121 |
| 6,555,906 B2 | * | 4/2003 | Towle et al. | 257/723 |
| 6,586,822 B1 | * | 7/2003 | Vu et al. | 257/678 |

* cited by examiner

Primary Examiner—Richard Chang
(74) Attorney, Agent, or Firm—Troxell Law Office PLLC

(57) ABSTRACT

A method for making a build-up package of a semiconductor die and a structure formed from the same. A copper foil with conductive columns is bonded to an encapsulated die by thermal compression, between thereof there is a pre-curing dielectric film sandwiched. The dielectric film is cured to form a dielectric layer of a die build-up package and the copper foil on the dielectric layer is etched to form the conductive traces. At least one conductive column in one of the dielectric layers is vertically corresponding to one of conductive column in the adjacent dielectric layer.

9 Claims, 5 Drawing Sheets

US 6,701,614 B2

METHOD FOR MAKING A BUILD-UP PACKAGE OF A SEMICONDUCTOR

FIELD OF THE INVENTION

The present invention is relating to a semiconductor die packaging method and structure, more particularly to a method for making a semiconductor die package using build up technology and a structure formed from the same.

BACKGROUND OF THE INVENTION

In conventional semiconductor packaging technology firstly a plurality of dies are adhered on a substrate, such as printed circuit board or lead frame being a die carrier for packaging the dies with an encapsulating material after electrically connecting by wire-bonding or TAB (Tape Automated Bonding) method. However with small-size and high-density trend of semiconductor dies, a flip-chip (face-down) mounting technology is brought up. At first a plurality of conductive solder bumps are formed on active surface of a die, then the die is mechanically and electrically bonded to a substrate, finally it is encapsulated. Due to the difference of two thermal expansion coefficients between the semiconductor die and substrate of plastic (or metal) material, the bumps between die and substrate suffer more stress. That is easy to happen fail of electrical connection between semiconductor die and substrate. Although an underfilling method is brought up for solving the problem of electrical disconnection, but it is unable to become a basic manufacturing process of flip chip because of underfilling time and production yield.

A packaging method is brought up in U.S. Pat. No. 6,271,469. A semiconductor die is encapsulated before electrical connection in advance. Electrical connection traces are formed on dielectric layers by means of build-up technology of manufacturing multi-layer printed circuit board. The common method accords with advanced semiconductor die package for packaging high-density and small-size dies. As shown in FIG. 1, the manufacturing method is adhering the active surface 106 of a die 102 having conductive pads 108 to a protective film 104 and then executing molding process to form an encapsulating material 112 that covers the back surface 114 and sides 116 of die 102, then the protective film 104 is removed away. The encapsulating material 112 has a surface coplanar to the active surface 106 of die 102. Furthermore as shown in FIG. 2, two dielectric layers 118 and 126 are formed by build-up method. The first dielectric layer 118, such as silicon nitride or silicon dioxide material, is formed on the surface of the encapsulating material 112 and the active surface 106 of die 102 by spin coating or vapor deposition. Besides, a plurality of vias are formed on the first dielectric layer 118 by laser drilling or photolithography method. A metal layer is formed on the first dielectric layer 118. A plurality of conductive traces 124 are etched by photolithography method from the metal layer. Similarly, the second dielectric layer 126, vias and metal layer are formed in turn, a plurality of conductive plugs 132 and conductive pads 134 are formed by etching the metal layer. Then, a solder resist 136 is formed by printing, and etched to form a plurality of openings. Conductive solder bumps 138 are formed on the openings of the solder resist 136 to become outer electrical connecting terminals of the semiconductor build-up package. In the manufacturing process, the dielectric layers and metal layer in the semiconductor build-up package are formed in turn and the vias are opened on each of the dielectric layers. Besides, the diameter of vias formed on the first dielectric layer 118 and the interval between two adjacent vias are severely required to be pretty tiny for corresponding to the bonding pads 108 of die 102. It is rather difficult to manufacture the conductive traces 124 that connect the bonding pads 108 of die 102 through the vias. Also the thickness of the conductive traces 124 deposited in the vias is not easy to keep even. A fail of electrical connection may happens.

SUMMARY

The first object of the present invention is to provide a method for making a build-up package of a semiconductor die. A copper foil with conductive columns and a dielectric film are thermally compressed with an encapsulating material having a die. Then, the dielectric film is cured to form a dielectric layer with electrical connection. Therefore, the common step of forming the vias on the dielectric layer can be eliminated for making a build-up package rapidly.

The second object of the present invention is to provide a method for making a build-up package on a semiconductor die. A copper foil with conductive columns and a dielectric film are thermally compressed with an encapsulating material having a die. Then, the dielectric film is cured to form a dielectric layer with electrical connection. After repeating thermal compression, multi-dielectric layers with vertically corresponding "column-on-column" configuration may be made for shortening wire-disposing space and enhancing electrically connecting efficiency.

The third object of the present invention is to provide a build-up package of a semiconductor die. Conductive columns extending through a first dielectric layer are bonded on the bonding pads of die for ensuring excellent electrical connection.

The fourth object of the present invention is to provide a build-up package of a semiconductor die. Each dielectric layer with a plurality of vertically conductive columns is formed on the encapsulating material by build-up stacking. Some conductive columns vertically correspond on the conductive columns of adjacent dielectric layer for completing electrical connections with fewer dielectric layers and shorter conductive path.

According to the present invention, a method for making a build-up package of a semiconductor die is firstly to form an encapsulating material to carry dies. Then, a copper foil with conductive columns is bonded onto the encapsulating material by thermal compression, and a pre-curing dielectric film is interposed between the copper foil and the encapsulating material. The dielectric film is cured to form a dielectric layer of a build-up die package. It is better that the steps of thermal compression and curing are executed simultaneously. Thereafter, the etching process can be performed on the dielectric layer so that the copper foil becomes conductive pads and conductive traces electrically connecting the conductive columns. Besides, the conductive pads of the most outside dielectric film are bonded with solder balls or pins. The conductive columns could be any kind of conductive materials, such as solder materials by printing or electroplating on the copper foil or the metal columns (like copper columns) bonded on the copper foil by solder paste or ACF (anisotropic conductive film).

According to the present invention, a build-up package of a semiconductor die comprises a die, an encapsulating material for carrying the die and at least a dielectric layer. The encapsulating material has a surface to expose the bonding pads of the die. The dielectric film is formed on the surface of the encapsulating material and has a plurality of conductive columns through the dielectric film to electrically connect with the bonding pads of the die. It is better that the build-up die package further includes a plurality of dielectric layers stacking on the surface of the encapsulating material. Some conductive columns are vertically corresponding to the conductive columns of adjacent dielectric layer. A circuit layer is formed between the two adjacent dielectric layers.

DETAILED DESCRIPTION OF THE PRESENT INVENTION

Figure 1:
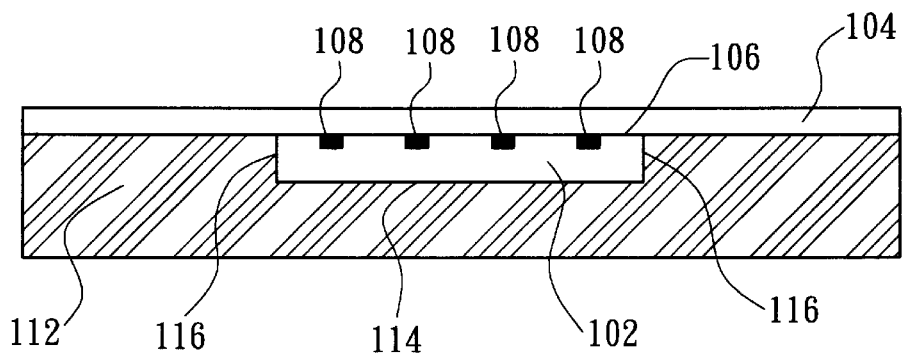
FIG. 1 is a cross-sectional view of an encapsulated semiconductor die disclosed in U.S. Pat. No. 6,271,469 "direct build-up layer on an encapsulated die package".
Figure 2:
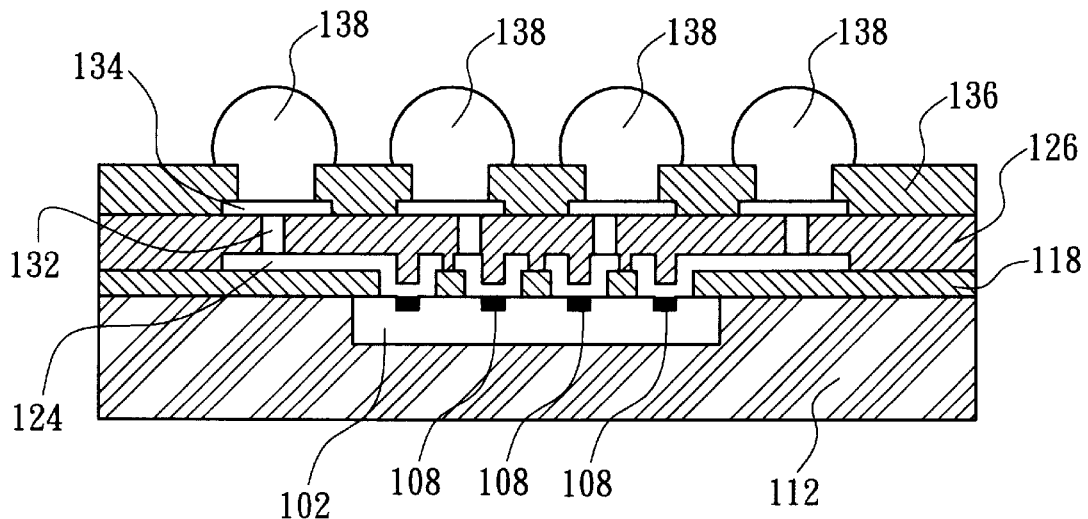
FIG. 2 is a cross-sectional view of a build-up package of a semiconductor die disclosed in U.S. Pat. No. 6,271,469 "direct build-up layer on an encapsulated die package".

Referring to the drawings attached, the present invention will be described by means of the embodiments below.

Figure 3:
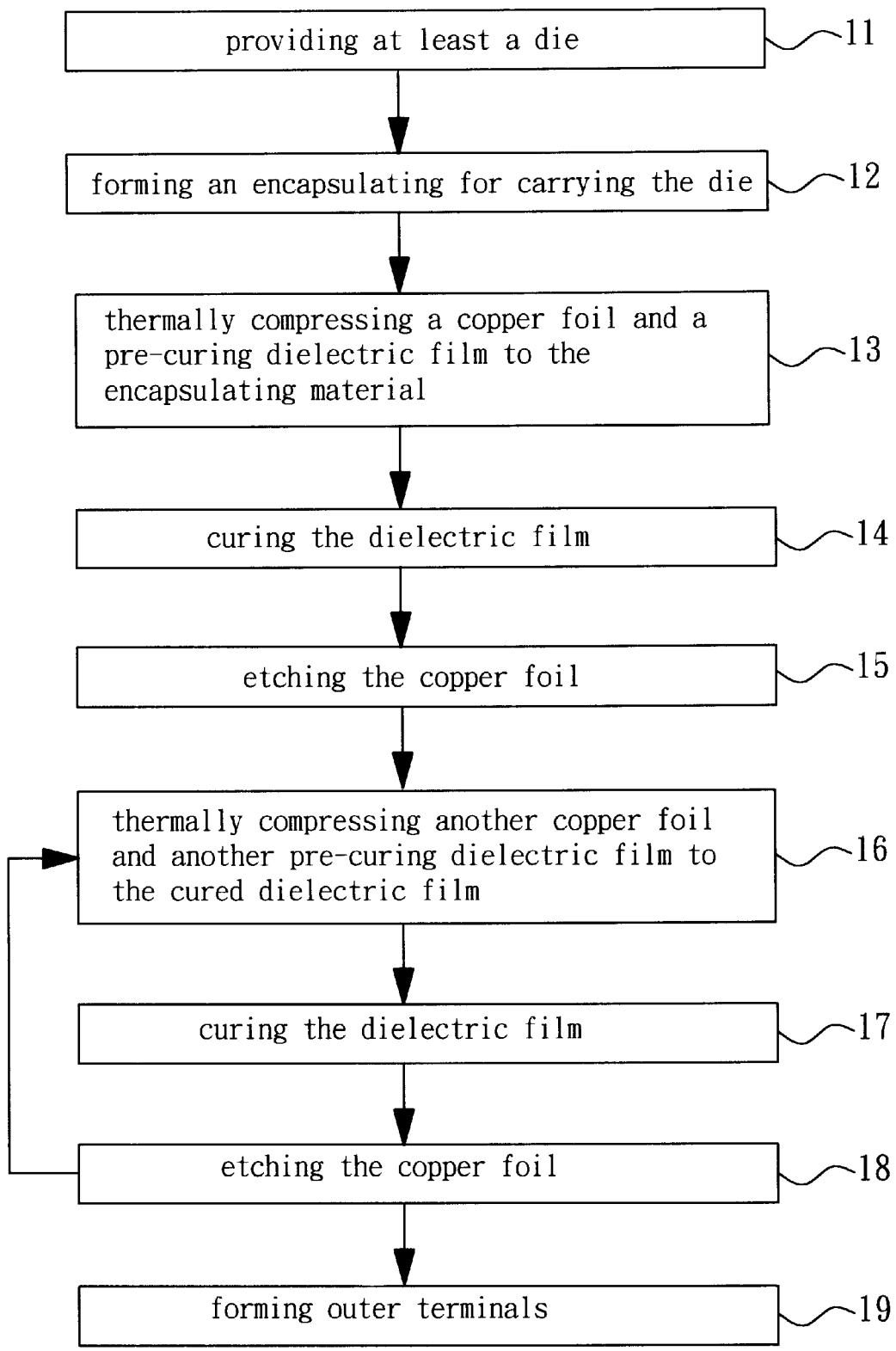
FIG. 3 is a flow chart of a method for making a build-up package of a semiconductor die in accordance with an embodiment of the present invention.

According to an embodiment of the present invention, FIG. 3 is a flow chart of a method for making a build-up package of a semiconductor die. FIG. 4a to FIG. 4h are cross sectional views of a method for making a build-up package of a semiconductor die.

Figure 4A:
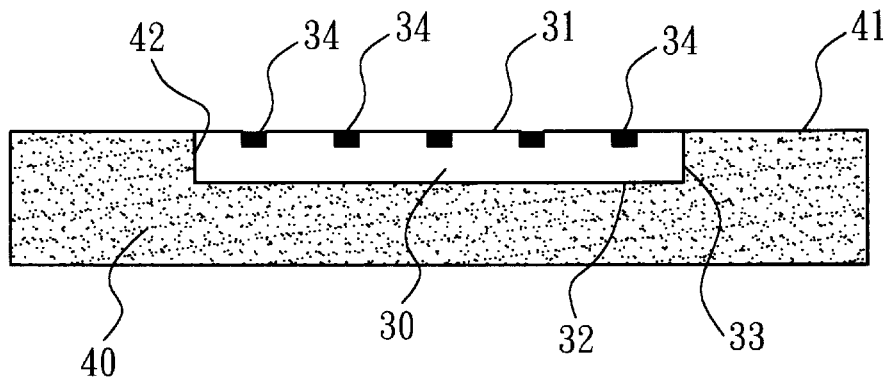
FIGS. 4a–4h are side cross sectional views of a preferred method for making a build-up package of a semiconductor die in accordance with an embodiment of the present invention.

As shown in FIG. 3 and FIG. 4a, first in the step 11 of "providing a die", a die 30 is provided, such as a microprocessor, microcontroller, memory, or ASIC chip for special application. It is better that the die 30 is an advanced chip with dense terminals and high-density (the number of I/O is more than one hundred). The die 30 has an active surface 31, a back surface 32, and sides 33 between active surface 31 and back surface 32. The bonding pads 34 are formed on the active surface 31 of the die 30. Also a plurality of solder bumps or small-sized solder balls may be bonded on the bonding pads 34.

Thereafter, in the step 12 of "forming an encapsulating material", an encapsulating material 40 is formed for carrying the die 30, the die 30 is combined with the encapsulating material 40. The encapsulating material 40 has a surface 41 to expose the bonding pads 34 of die 30. In this embodiment, a depression 42 is formed on the surface 41 of the encapsulating material 40 to contain the die 30, so that the active surface 31 of the die 30 is coplanar to the surface 41 of the encapsulating material 40. One of the methods for making the encapsulated die 30 mentioned above is firstly adhering the active surface 31 of the die 30 to a protective film (not shown in the drawing). Then, the encapsulating material 40 is formed by means of molding or printing technique before removing the protective film. Another method for making the encapsulated die 30 is firstly encapsulating the die 30 with the encapsulating material 40 and executing laser drilling to expose the bonding pads 34 of the die 30. Alternatively, firstly a pre-molding operation is executed to form an encapsulating material 40 with a depression 42 and then the die 30 is adhered into the depression 42 of the encapsulating material 40. The methods described above can be worked and not limited to the present invention. Preferably, the surface 41 of the encapsulating material 40 is planar for building up dielectric layers and conductive traces.

Figure 4B:
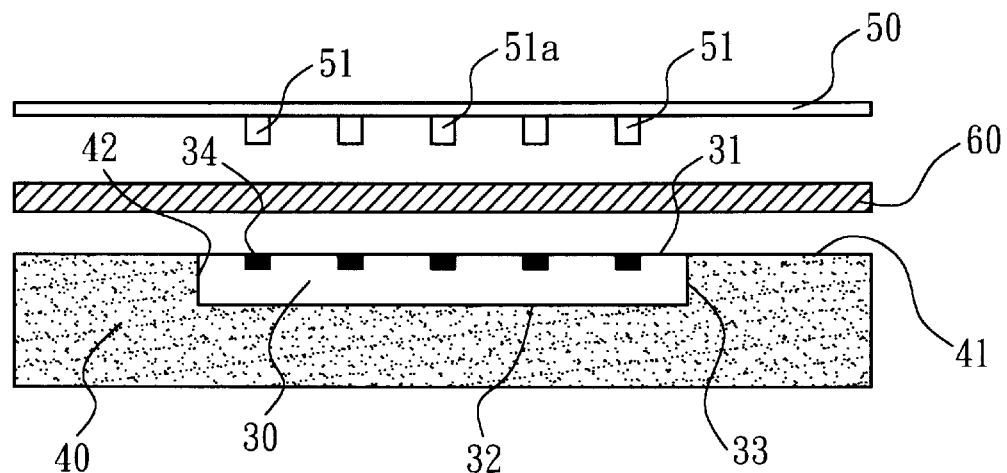

As also shown in FIG. 3 and FIG. 4b, in the step 13 of "thermal compression of a copper foil" 13, the first copper foil 50 and the first dielectric film 60 are thermally compressed onto the surface 41 of the encapsulating material 40. The first copper foil 50 has a plurality of vertically conductive columns 51 corresponding to the bonding pads 34 of die 30. The conductive columns 51 bonded on the first copper foil 50 could be any kind of conductive materials, such as the solder materials by printing or electroplating on the first copper foil 50, or the metal columns (like copper columns) by means of solder paste or ACF (anisotropic conductive film) to bond on the first copper foil 50. There is a pre-curing first dielectric film 60 between the first copper foil 50 and the encapsulating material 40 during thermal compression. Due to the sandwiched first dielectric film 60, the first copper foil 50 is not directly contacting the encapsulating material 40. But the step 13 of thermal compression enables the conductive columns 51 of the first copper foil 50 to penetrate the first dielectric film 60 until bonding on the bonding pads 34 of die 30. The first dielectric film 60 is a B-staged polymer, such as one kind of pre-curing thermosetting resin, it also is called "prepreg" with proper plastic and fusible configuration, but not in liquid phase of fully flowing. In this thermal compressing process, the conductive columns 51 of the first copper foil 50 passing through the first dielectric film 60 for electrically connecting the bonding pads 34 of die 30.

Figure 4C:
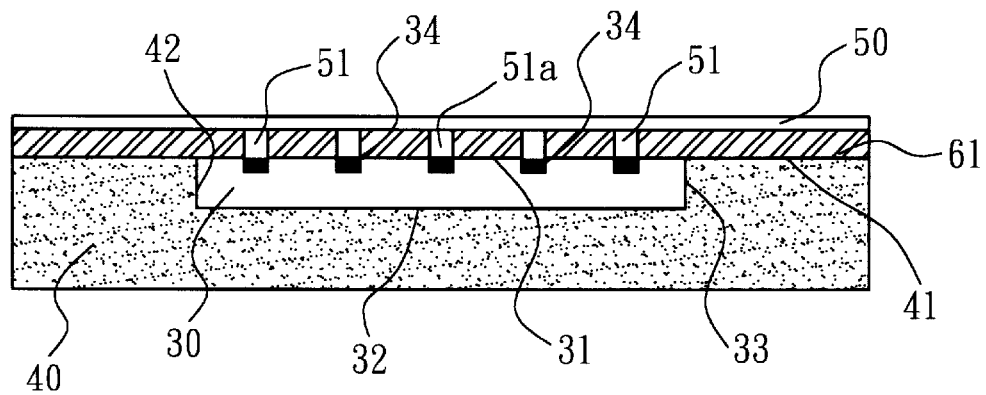

As shown in FIG. 3 and FIG. 4c, in the step 14 of "curing dielectric film", the first dielectric film 60 is cured to become a C-staged polymer for forming a first dielectric layer 61. The first dielectric layer 61 combines the encapsulating material 40 and the first copper foil 50 because of it no longer possesses plasticity and fusibility. It is better that the step 13 of thermal compression of a copper foil and the step 14 of "curing dielectric film" 14 are executed simultaneously to simplify the manufacturing process. The first dielectric film 60 suitable for executing the step 13 of thermal compression and the step 14 of curing is a prepreg comprising polymers such as epoxy resin or a nanocomposite material. It is preferable that the curing temperature of the first dielectric film 60 matches with the temperature of thermal compression.

Figure 4D:
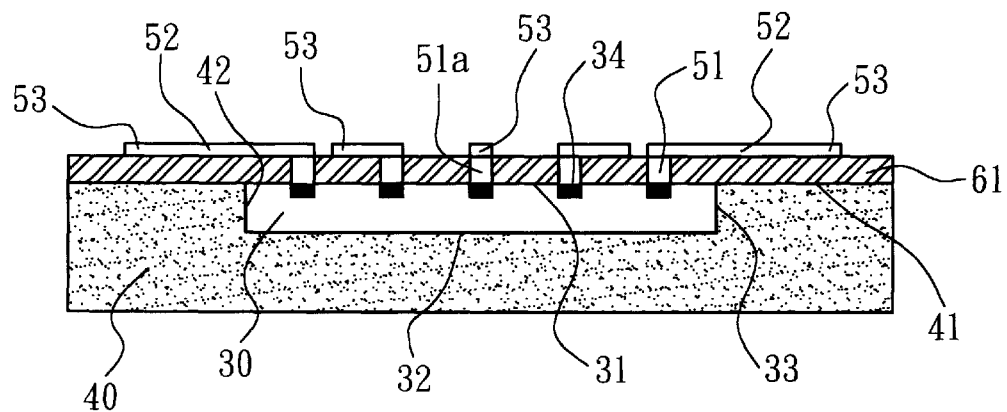

After the step 14 of "curing dielectric film", the conductive columns 51 are supported by the first dielectric layer 61. Thereafter, as shown in FIG. 3 and FIG. 4d, the step 15 of "etching copper foil" 15 is executed. The first copper foil 50 is etched after photolithography to form a patterned circuit layer, including the conductive traces 52 and the conductive pads 53 electrically connect with the corresponding conductive columns 51.

Figure 4E:
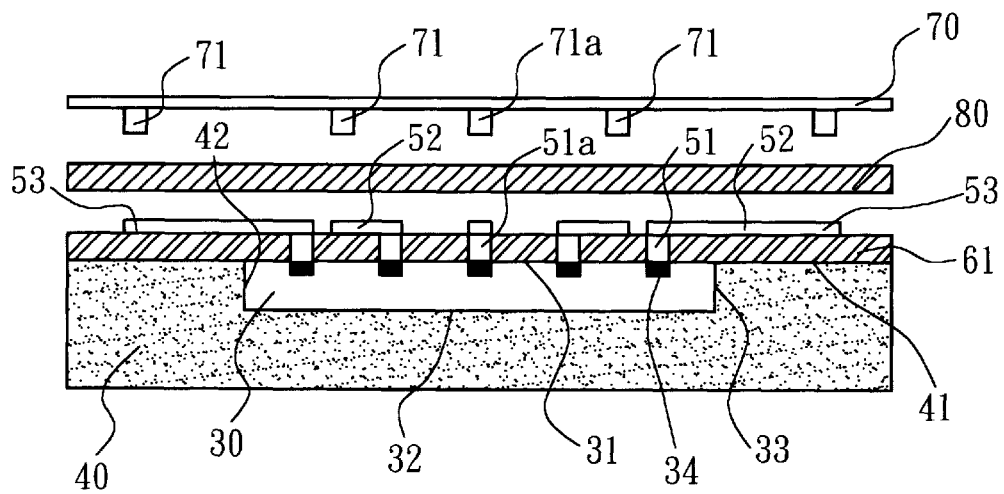
Figure 4F:
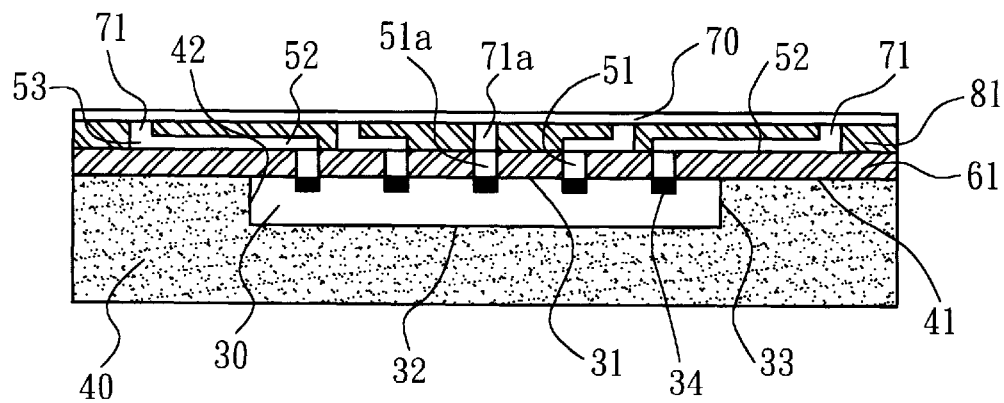
Figure 4G:
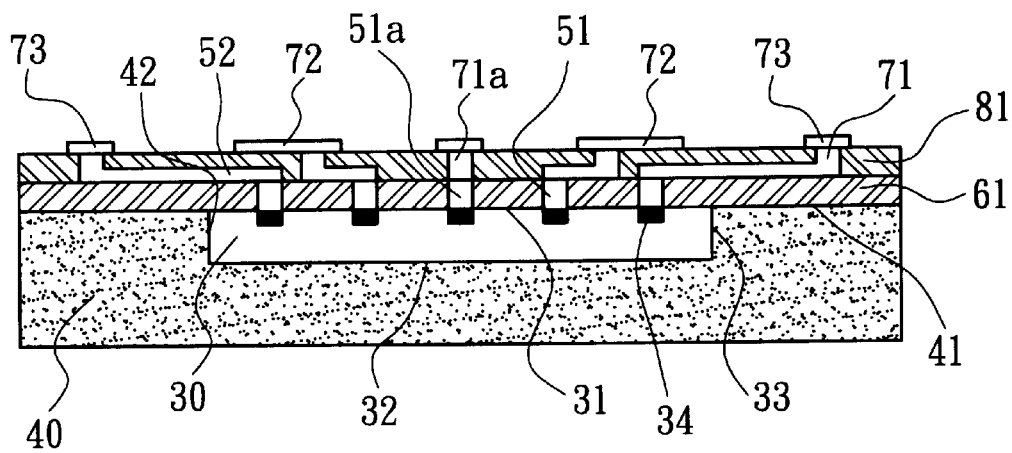

Thereafter, another step 16 of "thermal compression of copper foil" 16 is further executed. As shown in FIG. 3 and FIG. 4e, the second copper foil 70 is thermally compressed accompanied by a second dielectric film 80 together so as to bond on the first dielectric layer 61 (that is the cured first dielectric film 60). The second copper foil 70 has a plurality of conductive columns 71 bonded by solder paste or ACF (anisotropic conductive film). The pre-curing second dielectric film 80 is sandwiched between the second copper foil 70 and the first dielectric layer 61. The second dielectric film 80 is a B-staged polymer, it may be as same as the first dielectric film 60 or not. The conductive columns 71 extending through the second dielectric film 80 electrically connect with the conductive pads 53 on the lower first dielectric layer 61 during thermal compression and electrically couple the conductive columns 51 and bonding pads 34 of die 30. As shown in FIG. 3 and FIG. 4f, in the step 17 of "curing dielectric film", the second dielectric film 80 is cured to become the second dielectric layer 81. The step 17 of "curing dielectric film" and the step 16 of "thermal compression of copper foil" may be executed simultaneously. Thereafter, as shown in FIG. 3 and FIG. 4g, the step 18 of "etching copper foil" is executed, then the second copper foil 70 is etched to become a patterned circuit layer, including conductive traces 72 and conductive pads 73 which electrically connect with the corresponding conductive columns 71. Therefore, according to characteristics and trace distribution of IC product, the steps 16, 17 and 18 about thermally compression, curing dielectric film and etching copper foil are repeatedly executed, so that a plurality of dielectric layer keep stacking on the encapsulating material 40.

Figure 4H:
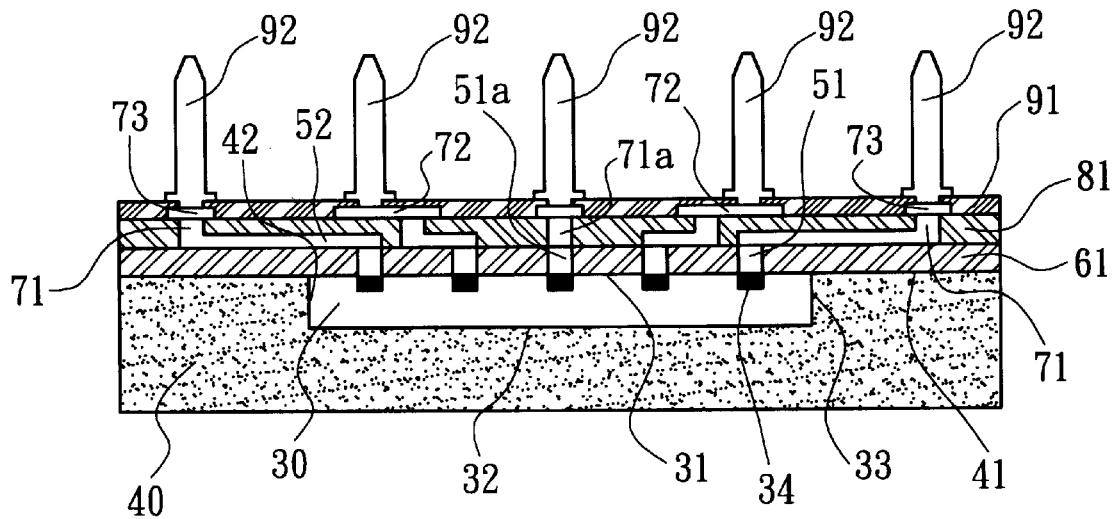

After completing the multi-dielectric layers 61 and 68 or even more, as shown in FIG. 3 and FIG. 4h, the step 19 of "forming outer terminals" 19 is executed. A solder mask layer 91 is printed on the most outside dielectric layer (that is the second dielectric layer 81 in this embodiment). Then, a plurality of vias are formed above the conductive pads 73 of the most outside dielectric layer by photolithography technology and then a plurality of pins 92 or solder balls are bonded on the conductive pads 73. Finally, a build-up package of a semiconductor die is fabricated (as shown in FIG. 4h).

In the respect of mass production, a plurality of dies are encapsulated by an encapsulated material. After thermal compression, curing and etching, the encapsulated material is diced to form a plurality of build-up die packages.

In accordance with the method for making a build-up package of a semiconductor die of the present invention, by means of thermal compression, the conductive columns 51 and 71 extending through the B-staged dielectric films 60 and 80. Then the dielectric films 60 and 80 are cured to become the C-staged dielectric layers 61 and 81. It is not necessary to form via holes on dielectric layers 61 and 81 by photolithography technology, so that the process of making a build-up die package is quite rapid. Furthermore, after repeatedly thermal compression, curing and etching, the multi dielectric layers on the encapsulating material have column-on-column configuration, some columns of which are vertically corresponded each other. Some of the conductive columns 51a at the same layer are vertically corresponding to the conductive columns 71a at the adjacent layer (as shown in FIG. 4h) for shortening trace-disposing path and enhancing electrical efficiency.

Therefore, as shown in FIG. 4h, according to the invention the build-up package of a semiconductor die includes an encapsulating material 40 for carrying the die 30. The encapsulating material 40 has a surface 41 uncovering the bonding pads 34 of the die 30. The first dielectric layer 61 is formed on the surface 41 of the encapsulating material 40 and fixing a plurality of conductive columns 51. The conductive columns 51 extend through the first dielectric layer 61 so as to bond the bonding pads 34 of the die 30 for ensuring excellent electrical connection. A circuit layer etched from first copper foil 50 and the second dielectric layer 81 are formed above the first dielectric layer 61. The second dielectric layer 81 also has a plurality of conductive columns 71 that extending through the second dielectric layer 81 for electrically connecting the conductive columns 51 of the first dielectric layer 61. Some of the conductive columns 51a of the first dielectric layer 61 are vertically corresponding to conductive columns 71a of the adjacent second dielectric layer 81 so that the build-up die package has a column-on-column configuration for completing the traces distribution of build-up with fewer dielectric layers and the shortest conductive paths.

The above description of embodiments of this invention is intended to be illustrated and not limiting. Other embodiments of this invention will be obvious to those skilled in the art in view of the above disclosure.

What is claimed is:

1. A method for making a build-up package of a semiconductor die comprising the steps of:

a) providing at least a die having an active surface with a plurality of bonding pads;

b) forming an encapsulating material for carrying the die, the encapsulating material having a surface to expose the bonding pads of the die;

c) thermally compressing a copper foil and a pre-curing dielectric film together to the surface of the encapsulating material, the copper foil having a plurality of conductive columns corresponding to the bonding pads of the die, the dielectric film sandwiched between the copper foil and the encapsulating material;

d) curing the dielectric film; and e) etching the copper foil to form the conductive pads which electrically connect the conductive columns.

2. The method of claim 1, further comprising the steps of:

f) thermally compressing another copper foil and another pre-curing dielectric film to the cured dielectric film, the copper foil having a plurality of conductive columns which electrically connect with the conductive pads on the cured dielectric film, the pre-curing dielectric film sandwiched between the copper foil and the cured dielectric film;

g) curing the dielectric film; and h) etching the copper foil to form the conductive pads electrically connecting the conductive columns.

3. The method of claim 2, wherein the steps of f, g, and h are executed repeatedly until reaching the required layer number of the dielectric layers.

4. The method of claim 1, further comprising the step of: forming a plurality of solder balls or pins on the conductive pads.

5. The method of claim 1, wherein the step of thermal compression and the step of curing are executed simultaneously.

6. The method of claim 1, wherein the dielectric film comprises epoxy resin or nanocomposite material.

7. The method of claim 1, wherein the conductive columns are made of metal.

8. The method of claim 1, wherein the conductive columns are formed on the copper foil by electroplating, printing or soldering.

9. The method of claim 8, wherein the conductive columns are bonded on the copper foil with solder paste or ACF (anisotropic conductive film).

* * * * *